United States Patent
Raiteri

Patent Number: 6,155,548
Date of Patent: Dec. 5, 2000

[54] FIXTURE FOR ALIGNING AND CLAMPING A WORKPIECE, IN PARTICULAR A PACK OF PRINTED CIRCUIT BOARDS, ON A MACHINE TOOL

[76] Inventor: Angelo Raiteri, 10015, Ivrea (Italy) Via Soana, 6Y, Italy

[21] Appl. No.: 09/173,663

[22] Filed: Oct. 15, 1998

[30] Foreign Application Priority Data

Oct. 17, 1997 [IT] Italy .................................. TO9710914

[51] Int. Cl.[7] .................................................. B25B 11/00
[52] U.S. Cl. ............................................. 269/22; 269/903
[58] Field of Search ................................ 269/20, 22, 266,
269/903; 254/93 HP; 92/90, 93, 94, 96,
103 F, 104

[56] References Cited

U.S. PATENT DOCUMENTS

| | | |
|---|---|---|
| 3,808,968 | 5/1974 | Notin . |
| 4,643,408 | 2/1987 | Stoll ........................................... 269/22 |
| 4,813,657 | 3/1989 | Todd ......................................... 269/22 |
| 4,982,831 | 1/1991 | Irie et al. . |
| 5,593,146 | 1/1997 | Dittrich et al. ............................ 269/22 |
| 5,906,364 | 5/1999 | Thompson et al. ....................... 269/22 |

FOREIGN PATENT DOCUMENTS

| | | |
|---|---|---|
| 0 541 022 A1 | 10/1992 | European Pat. Off. . |
| 35 40 235 A1 | 11/1985 | Germany . |
| 565401 | 2/1943 | United Kingdom . |

*Primary Examiner*—Robert C. Watson
*Attorney, Agent, or Firm*—Sheridan Ross P.C.

[57] ABSTRACT

The fixture has a pair of plates for supporting a pack of printed circuit boards having two locating pins projecting from one face of the pack and which are housed inside a gap between the two plates. The plate is fitted with a fixed bar, while the other plate is fitted with a movable bar associated with a conduit made of elastomeric material, extending parallel to the movable bar, and which is deformed by means of compressed air to move the movable bar towards the fixed bar to clamp the pin. The first plate also carries a locating member having a V-shaped seat, which cooperates with the movable bar to locate and clamp the other pin and so align the pack on the fixture.

7 Claims, 3 Drawing Sheets

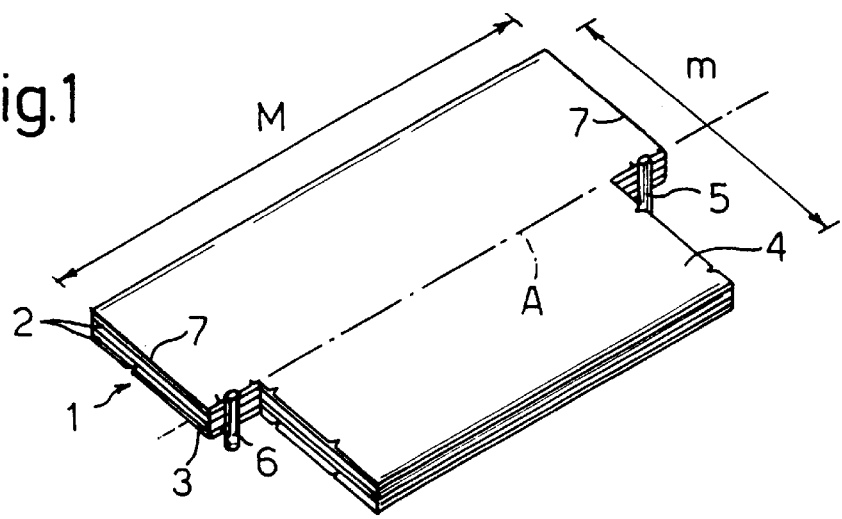
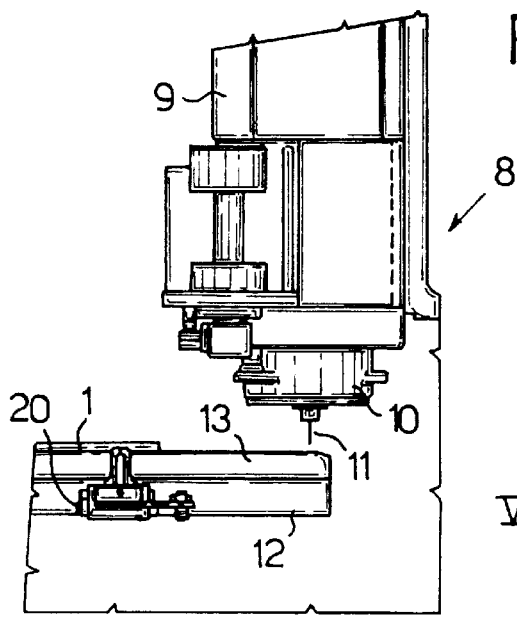
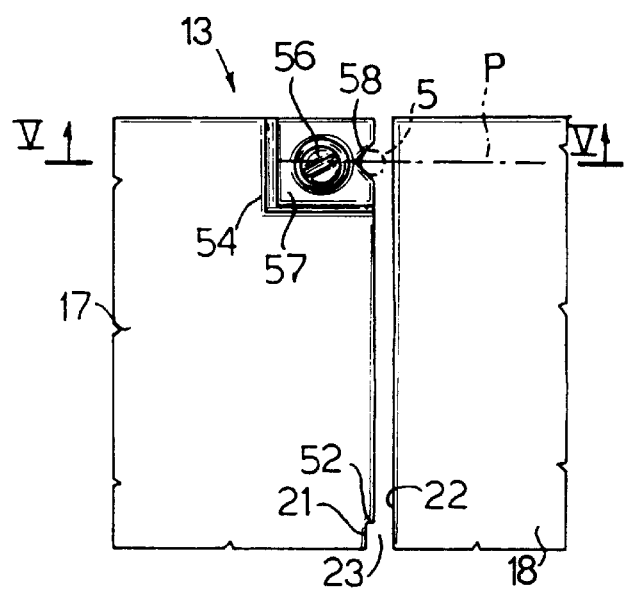

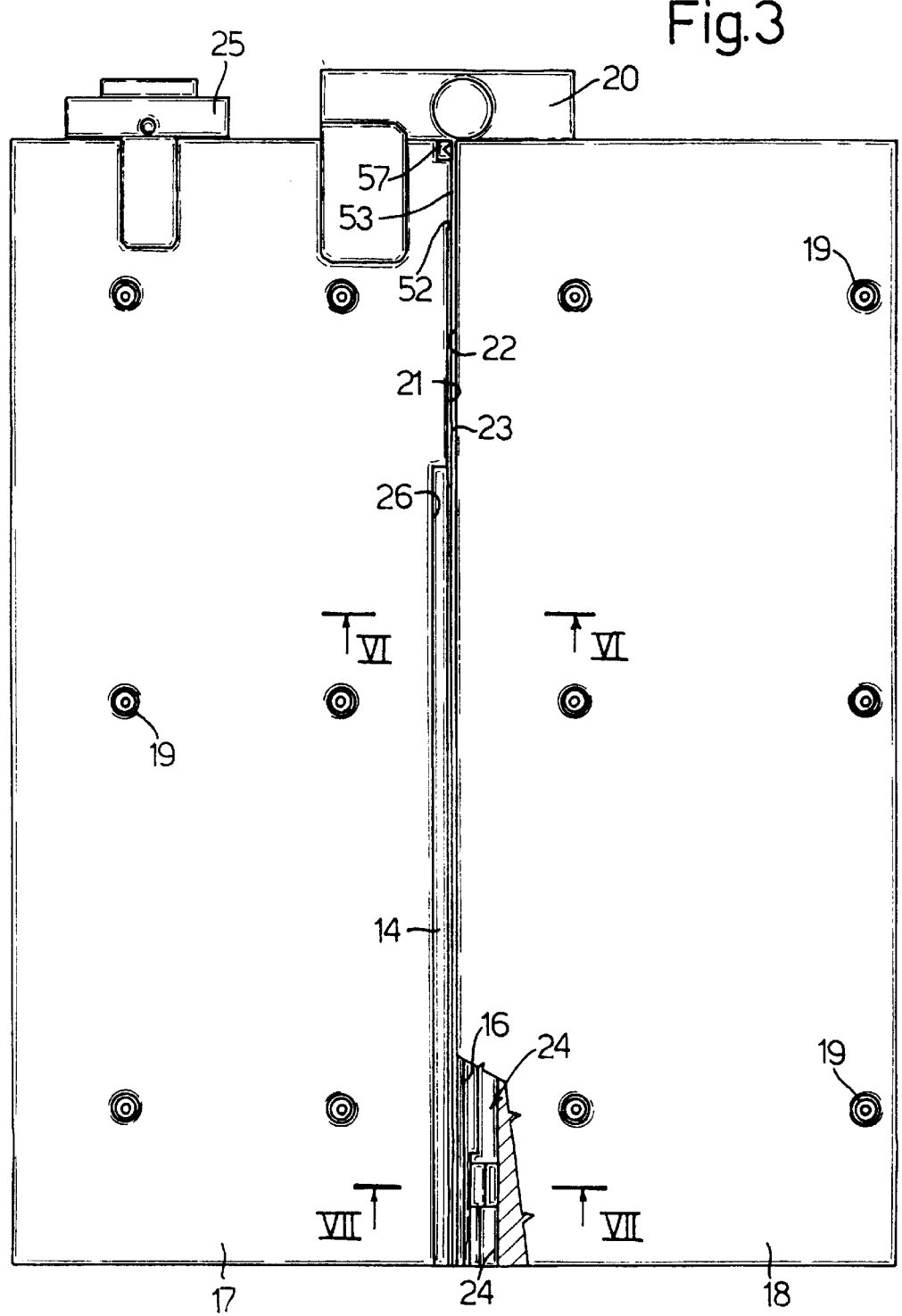

FIXTURE FOR ALIGNING AND CLAMPING A WORKPIECE, IN PARTICULAR A PACK OF PRINTED CIRCUIT BOARDS, ON A MACHINE TOOL

BACKGROUND OF THE INVENTION

The present invention relates to a fixture for aligning and clamping a workpiece, in particular a pack of printed circuit boards, on a machine tool.

As is known, a piece to be worked on a machine tool must be positioned accurately on the worktable of the machine, which is achieved by means of locating elements normally provided on the workpiece. In the case of packs of printed circuit boards, each pack is provided with a pair of pins projecting from one face of the pack, and which are fitted inside seats on an aligning and clamping fixture.

In one known fixture for packs of printed circuit boards, one of the pins is brought in correspondence with a pair of bars, one of which is moved parallel to itself by a complex mechanism; and the fixture also comprises an aligning or locating member in which the other pin is located and then positioned and clamped by an independent actuator by means of a further mechanism.

The above fixture has several drawbacks. In particular, it is complicated, bulky and fairly expensive, on account of the numerous component parts of the two mechanisms. Moreover, requiring two actuators necessarily operated in a predetermined sequence, the fixture is relatively slow-operating and subject to mistiming.

SUMMARY OF THE INVENTION

It is an object of the present invention to provide a highly straightforward, reliable fixture for aligning and clamping a workpiece on a machine tool, and which provides for eliminating the aforementioned drawbacks of known fixtures.

According to the present invention, there is provided a fixture for aligning and clamping a workpiece on a machine tool, wherein the workpiece comprises a pair of locating elements, and wherein the fixture is carried by a worktable and comprises a pair of jaws movable with respect to each other; said jaws engaging at least one of said locating elements; characterized in that at least one of said jaws is operatively associated with a container made of elastomeric material and connected to supply means for supplying a pressurized fluid; said pressurized fluid deforming said container to so move said jaw as to fix said locating element to the fixture.

BRIEF DESCRIPTION OF THE DRAWINGS

A preferred, non-limiting embodiment of the present invention will be described by way of example with reference to the accompanying drawings, in which:

FIG. 1 shows a view in perspective of a pack of printed circuit boards for machining;

FIG. 2 shows a schematic partial side view of a machine tool incorporating an aligning and clamping fixture in accordance with the present invention;

FIG. 3 shows a larger-scale, partially sectioned plan view of the aligning and clamping fixture;

FIG. 4 shows a larger-scale detail of FIG. 3;

DETAILED DESCRIPTION OF THE INVENTION

Figure 5:
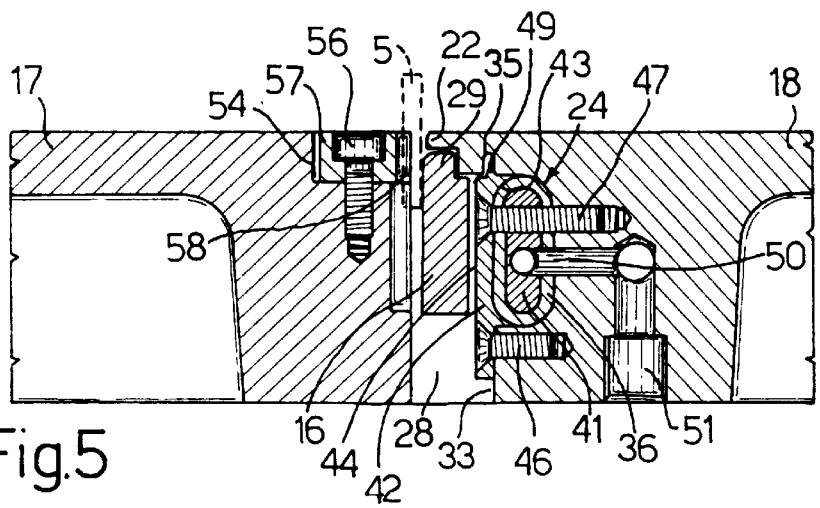
FIG. 5 shows a partial section along line V—V in FIG. 4.

Number 1 in FIG. 1 indicates as a whole a pack of printed circuit boards 2 as arranged for machining, which normally comprises drilling and milling. Pack 1 is substantially rectangular with a short side or smaller dimension m and a long side or larger dimension M, and comprises an auxiliary bottom board 3 and an auxiliary cover board 4.

Boards 2–4 are connected to one another by a pair of locating elements defined by cylindrical pins 5 and 6, which are located along the center line A of pack 1, close to two edges 7 parallel to short side m, and project a given length from the bottom face of auxiliary bottom board 3. As pack 1 may vary in size within certain limits, the distance between pins 5 and 6 varies according to the size of boards 2.

Number 8 in FIG. 2 indicates as a whole a machine tool comprising a machining head 9 having a spindle 10 with a tool 11; and a worktable 12 fitted with a fixture indicated as a whole by 13 and for receiving pins 5 and 6 to align and clamp pack 1 for machining.

Fixture 13 (FIG. 3) comprises a pair of jaws defined by a pair of straight parallel bars 14 and 16 carried by two coplanar plates 17 and 18, which are fitted rigidly to table 12 by means of screws 19, and have two facing edges 21 and 22 defining a gap 23 in which pins 5 and 6 are located. Plate 17 is also fitted with a support 20 for the usual gripper for changing tool 11 (see also FIG. 2), and with an optical tool sensor 25.

Bar 14 is carried by plate 17 and fixed, whereas bar 16 is carried by plate 18 (see also FIG. 6) and movable, parallel to itself, towards fixed bar 14 to clamp pack 1 on fixture 13. Both bars 14 and 16 are made of extremely hard material and machined accurately.

According to the invention, the movable bar 16 is operatively associated with a container 24 made of elastomeric material and which is deformed by a pressurized fluid to move bar 16 towards fixed bar 14. More specifically, fixed bar 14 has a rectangular cross section and is fitted, by means of screws 27, inside a cavity 26 along edge 21 of plate 17, so that the two sides of bar 14 having greater length are vertical.

Cavity 26 extends along a given length of edge 21 to engage one of pins 5, 6 regardless of the length of side M of pack 1; and the thickness of fixed bar 14 is substantially equal to the width of cavity 26, so that bar 14 is flush with the portion of edge 21 having no cavity 26.

Edge 22 of plate 18 is perfectly straight, and has an underside recess 28 (FIG. 6) housing movable bar 16. Bar 16 has a substantially rectangular cross section with the two long sides also positioned vertically, has an upper tooth 29 housed inside a complementary groove 30 formed in plate 18, and is fitted, by means of screws 31, with a leaf spring 32 extending along a given length of bar 16 and the bottom edge of which is fitted by screws 34 to a wall 33 of plate 18.

The top edge of leaf spring 32 engages a vertical groove 35 formed in the top wall of recess 28; the vertical walls of groove 35 determine the travel of the top edge of leaf spring 32; and wall 33 of plate 18 slopes slightly to the right to create a certain preload on leaf spring 32, which is thus kept resting against the right-hand wall of groove 35 and keeps bar 16 flush with edge 22 of plate 18.

Container 24 comprises a conduit 36 having a substantially oblong cross section with a wall 37 parallel to leaf spring 32. More specifically, the cross section of conduit 36 is in the form of a rectangle, the short sides of which are defined by semicircular edges; and recess 28 in plate 18 comprises a groove 38 having a cross section complementary to half the cross section of conduit 36 and so forming a half-seat for the conduit.

The two ends of conduit 36 (FIGS. 5 and 7) are closed by respective plug members 39 and 41 made of rigid material, e.g. metal alloy; and, at each plug member 39, 41, a respective fastening member 42 is provided comprising a flat vertical outer surface 44, and an inner surface 43 having a cross section complementary to the other half of the cross section of conduit 36.

Each fastening member 42 is fixed at the bottom by means of a screw 46 screwed inside a threaded hole in wall 33 of plate 18, is fitted to conduit 36 and to respective plug member 39, 41 by means of a further screw 47 screwed inside a threaded hole in groove 38, and comprises an appendix 49 engaging groove 35. Screw 47 is so torqued that appendix 49 rests against the right-hand wall of groove 35, which therefore acts as a rigid support for member 42.

Plug member 41 has a hole 50, which also extends through the wall of conduit 36 and connects the inside of conduit 36 to a hole 51 in plate 18; and hole 51 houses a fitting for a conduit, which, via a solenoid valve of any known type, is connected to a compressed air supply device, e.g. supplying air at a pressure of 2.5 to 3.5 atmospheres.

Edge 21 of plate 17 also comprises a small shoulder 52 (FIGS. 3 and 4) defining a portion 53 in which gap 23 is smaller than the diameter, and therefore prevents insertion, of pins 5, 6; portion 53 terminates with a cavity 54 (FIGS. 4 and 5) in which a locating member 57 for locating one of pins 5, 6 is fitted by means of a screw 56; and member 57 comprises a V-shaped seat 58 having a plane of symmetry P perpendicular to movable bar 16, which cooperates with seat 58 to locate and clamp pin 5.

Aligning and clamping fixture 13 operates as follows.

When idle, the solenoid valve controlling compressed air supply to hole 51 is closed, and leaf spring 32 rests against the right-hand wall of groove 35 to align bar 16 with edge 22 of plate 18; and the operator places a pack 1 on fixture 13, by inserting pin 5 inside V-shaped seat 58 and pin 6 inside gap 23. Pin 6 is obviously inserted inside the portion of gap 23 in which plate 17 is fitted with fixed bar 14.

The solenoid valve is then activated to feed compressed air through holes 51 and 50 into conduit 36, which, along the portion not clamped by fastening members 42, inflates to overcome the action of leaf spring 32, which moves movable bar 16 towards fixed bar 14. If pins 5 and 6 are not inserted inside seat 58 and gap 23, the top edge of leaf spring 32 is arrested against the left-hand wall of groove 35.

Movable bar 16, on the one hand, pushes pin 5 inside V-shaped seat 58 to locate, i.e. align, pack 1 longitudinally on plates 17 and 18 of fixture 13, and, on the other, pushes pin 6 against bar 14 to orient pack 1 correctly on plates 17 and 18. The air pressure in conduit 36 is such as to clamp both pins 5 and 6, by means of movable bar 16, inside V-shaped seat 58 and against fixed bar 14 respectively.

Figure 6:
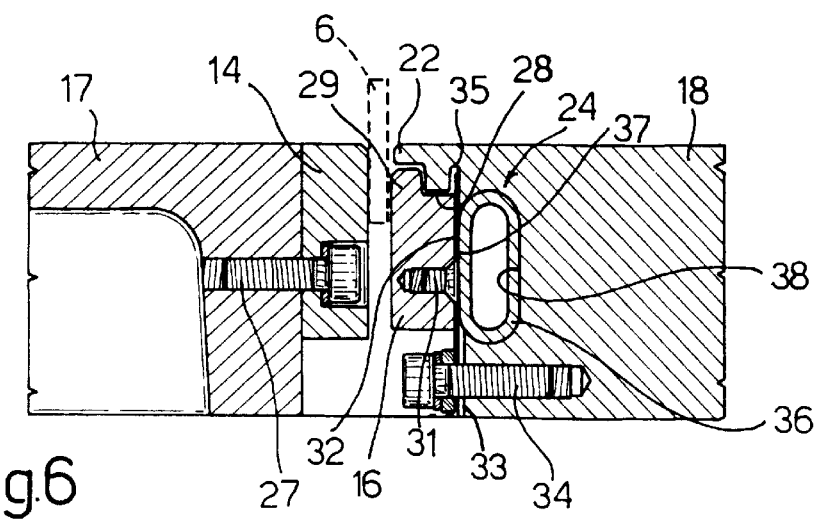
FIG. 6 shows a further larger-scale partial section along line VI—VI in FIG. 3.
Figure 7:
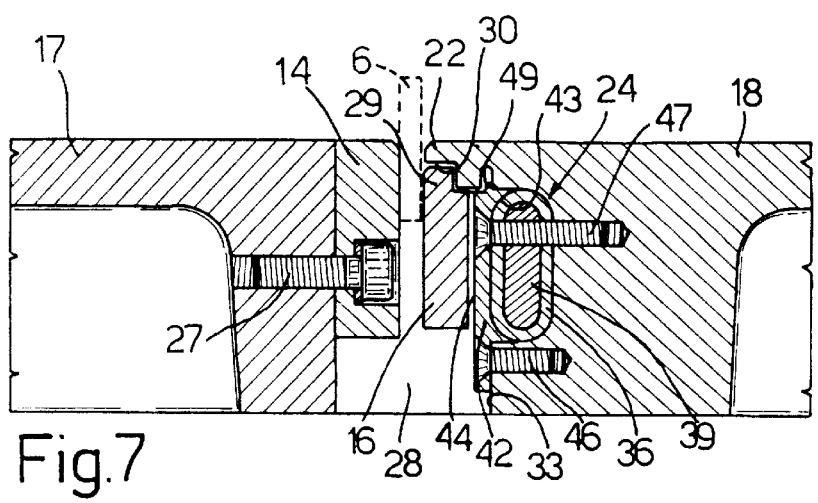
FIG. 7 shows a further larger-scale partial section along line VII—VII in FIG. 3.

Machine tool 8 then machines pack 1; after machining, the solenoid valve is disabled to exhaust the compressed air from conduit 36; leaf spring 32 restores bar 16 to the rest position shown in FIGS. 5–7; and the operator unloads the machined pack 1 off fixture 13.

Pack 1 may, of course, be loaded and unloaded by means of an automatic loading and unloading device. For example, pack 1 may be transferred from a loading station to fixture 13 and from fixture 13 to an unloading station by means of a suction-cup pickup device.

As compared with known fixtures, the advantages of the aligning and clamping fixture according to the invention will be clear from the foregoing description. In particular, the fixture is more reliable and cheaper to produce, by greatly reducing the number of parts required to move bar 16; and operation of the fixture to clamp the pack is faster, by virtue of one of the pins being located inside V-shaped seat 58 by movable bar 16 itself.

Clearly, changes may be made to the fixture as described and illustrated herein without, however, departing from the scope of the accompanying Claims. For example, as opposed to a pack of printed circuit boards, the fixture may be used for locating any workpiece on the worktable of a machine tool; conduit 36 may have an oval cross section, and may be fitted differently to plate 18; leaf spring 32 may be replaced by other elastic means for recalling bar 16; and means independent of bar 16 may be used for locating pin 5 in V-shaped seat 58.

What is claimed is:

1. A fixture for aligning and clamping a workpiece (1) on a machine tool (8), wherein the workpiece (1) comprises a pair of locating elements (5, 6), and wherein the fixture (13) is carried by a worktable (12) and comprises a fixed bar (14) and a moveable bar (16); said fixed bar (14) being fitted to a first plate (17) for supporting said workpiece (1); said moveable bar (16) being fitted to a second plate (18) for supporting said workpiece (1); said plates (17, 18) being so arranged as to define a gap (23) for housing at least one (6) of said locating elements (5, 6); said moveable bar (16) being operatively associated with a container (24) made of elastomeric material and connected to a supply means for supplying a pressurized fluid; said pressurized fluid deforming said container (24) to so move said moveable bar (16) so as to clamp said at least one locating element (6); said moveable bar (16) moving substantially parallel to itself toward said fixed bar (14), said container (24) comprising a conduit (36) made of elastomeric material and extending parallel to and substantially the whole length of said moveable bar (16); said conduit (36) being closed at ends by two plug members (39,41) made of rigid material, and wherein said conduit (36) has an oblong cross section, and is housed inside a half-seat (38) complementary to said cross section; said half-seat (38) being provided on said second plate (18); and said conduit and said plug members (39,41) being fitted to each other by a pair of fastening members (42), each having a further half-seat (43) complementary to said cross section.

2. A fixture as claimed in claim 1, characterized in that said fastening members (42) is fitted by means of screws (46, 47) to said second plate (18) and to said plug members (39, 41).

3. A fixture as claimed in claim 2, characterized in that said movable bar (16) is connected to elastic return means (32) over which the action of said fluid prevails.

4. A fixture as claimed in claim 1, wherein said workpiece is defined by a substantially rectangular pack (1) of printed circuit boards, comprising two parallel edges (7); and wherein said locating elements are defined by two cylindrical pins (5, 6) located at said edges (7) along the center line of said pack, and project from one face of said pack (1); the distance between said pins (5, 6) being variable; and the fixture being characterized by comprising a locating member (57) comprising a V-shaped seat (58) for one (5) of said pins (5, 6); said V-shaped seat (58) having a plane of symmetry (P) perpendicular to said movable bar (16).

5. A fixture as claimed in claim 4, characterized in that said locating member (57) is carried by said first plate (17); and in that said pin (5) is forced against said V-shaped seat (58) by said movable bar (16); the other (6) of said pins (5, 6) being forced by said movable bar (16) against said fixed bar (14).

6. A fixture for aligning and clamping a workpiece on a machine tool, wherein the workpiece comprises a pair of locating elements, and wherein the fixture is carried by a worktable and comprises a fixed bar and a moveable bar; said fixed bar being fitted to a first plate for supporting said workpiece; said moveable bar being fitted to a second plate for supporting said workpiece; said plates being so arranged as to define a gap for housing at least one of said locating elements; said moveable bar being operatively associated with a container made of elastomeric material and connected to a supply means for supplying a pressurized fluid; said pressurized fluid deforming said container to so move said moveable bar so as to clamp said at least one locating element; said moveable bar being connected to a leaf spring over which the action of said fluid prevails, said leaf spring comprising an edge fitted to said second plate; and another edge cooperating with stop means carried on said second plate to control the travel of said movable bar.

7. A fixture for aligning and clamping a workpiece on a machine tool, wherein the workpiece is defined by a substantially rectangular pack of printed circuit boards; said pack comprising two parallel edges and two cylindrical pins located close to said edges along a center line of said pack, and project from one face of said pack, the distance between said pins being variable; and wherein the fixture is carried by a worktable and comprises a fixed bar, a moveable bar and a locating member having a V-shaped seat for one of said pins; said fixed bar being fitted to a first plate for supporting said pack; said moveable bar being fitted to a second plate for supporting said pack; said V-shaped seat having a plane of symmetry perpendicular to said moveable bar; said plates and said locating member being so arranged as to define a gap for housing said pins; said movable bar being operatively associated with a container made of elastomeric material and connected to a supply means for supplying a pressurized fluid; said pressurized fluid deforming said container to so move said moveable bar so as to clamp said pins.

* * * * *

UNITED STATES PATENT AND TRADEMARK OFFICE
CERTIFICATE OF CORRECTION

PATENT NO. : 6,155,548
DATED : December 5, 2000
INVENTOR(S) : Angelo Raiteri

Page 1 of 1

It is certified that error appears in the above-identified patent and that said Letters Patent is hereby corrected as shown below:

[30] Foreign Application Priority Data

October 17, 1997  [IT]  Italy ..................... TO97A 000914

Signed and Sealed this

Twenty-fifth Day of September, 2001

Attest:

NICHOLAS P. GODICI
Attesting Officer
Acting Director of the United States Patent and Trademark Office